US007889505B1

(12) United States Patent
Beard

(10) Patent No.: US 7,889,505 B1
(45) Date of Patent: Feb. 15, 2011

(54) CAMOUFLAGE RETRACTABLE MEDIA SYSTEM

(76) Inventor: Morris L. Beard, 1501 78th Ave. North, Brooklyn Park, MN (US) 55444

( * ) Notice: Subject to any disclaimer, the term of this patent is extended or adjusted under 35 U.S.C. 154(b) by 744 days.

(21) Appl. No.: 11/877,914

(22) Filed: Oct. 24, 2007

Related U.S. Application Data

(60) Provisional application No. 60/854,960, filed on Oct. 28, 2006.

(51) Int. Cl.
*H05K 5/00* (2006.01)

(52) U.S. Cl. ...................................... 361/730; 361/800

(58) Field of Classification Search ................. 361/730, 361/752, 797, 800, 748, 737, 679.01, 679.02, 361/679.58, 600, 736; 439/946, 188, 131, 439/955

See application file for complete search history.

(56) References Cited

U.S. PATENT DOCUMENTS

| | | | | |
|---|---|---|---|---|
| 3,642,091 A | | 2/1972 | Nohara et al. | |
| 4,576,508 A | * | 3/1986 | Dickinson | 404/6 |
| 4,919,563 A | * | 4/1990 | Stice | 404/6 |
| 5,819,471 A | * | 10/1998 | Koerber | 49/49 |
| 5,975,792 A | | 11/1999 | Goeken et al. | |
| 6,099,200 A | | 8/2000 | Pepe et al. | |
| 6,754,916 B1 | * | 6/2004 | Cox | 4/541.1 |
| 6,769,569 B1 | | 8/2004 | Yu | |
| 6,952,349 B2 | * | 10/2005 | Gough et al. | 361/741 |
| 6,957,715 B2 | | 10/2005 | Christiansen | |
| 7,101,112 B2 | | 9/2006 | Burns et al. | |
| 7,218,746 B2 | * | 5/2007 | Schmidt et al. | 381/334 |
| 2005/0031411 A1 | | 2/2005 | Hensley | |
| 2006/0188110 A1 | | 8/2006 | Chen | |

FOREIGN PATENT DOCUMENTS

| | | | |
|---|---|---|---|
| DE | GB002211528 | * | 7/1989 |

* cited by examiner

*Primary Examiner*—Hung S Bui
(74) *Attorney, Agent, or Firm*—Neustel Law Offices

(57) ABSTRACT

A camouflage retractable media system for efficiently providing media devices (e.g. speakers, etc.) that retract out-of-sight when not in use. The camouflage retractable media system generally includes a casing including a first end and a second end, wherein the first end includes a first opening and wherein the first opening extends through the first end. A chamber extends within the casing, wherein the chamber interconnects with the first opening. A drive unit extends within the chamber and a media device extends from the drive unit. A cap is positioned adjacent the first opening of the casing, wherein the cap includes a camouflage covering with respect to a surrounding environment. The drive unit selectively extends the media device outwardly from the first opening when in use and retracts the media device back within the chamber when not in use.

16 Claims, 8 Drawing Sheets

CAMOUFLAGE RETRACTABLE MEDIA SYSTEM

CROSS REFERENCE TO RELATED APPLICATIONS

I hereby claim benefit under Title 35, United States Code, Section 119(e) of U.S. provisional patent application Ser. No. 60/854,960 filed Oct. 28, 2006. The 60/854,960 application is currently pending. The 60/854,960 application is hereby incorporated by reference into this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to media devices and more specifically it relates to a camouflage retractable media system for efficiently providing media devices that retract out-of-sight when not in use.

2. Description of the Related Art

Any discussion of the related art throughout the specification should in no way be considered as an admission that such related art is widely known or forms part of common general knowledge in the field.

Media devices (e.g. speakers, etc.) have been in use for years. Media devices are generally utilized indoors; however outdoor media devices are becoming increasingly popular especially around pools or other outdoor structures (i.e. spas, volleyball courts, etc.). Outdoor media devices are generally left outside and therefore must generally be constructed of a weatherproof configuration. It is common for the outdoor media devices and/or associated wires to corrode or become unpleasant looking (e.g. fade, etc.) over time. Even with a weatherproof casing, harsh outdoor elements can wear away at a media device.

Another problem with outdoor media devices is the possibility that the media devices may be stolen. For this reason, many people purchase cheap or low quality media devices thus preventing the individual from achieving superior sound or quality from their media devices, which may be all the more needed in an outside environment where there are generally many other noises for the speakers to contend with. Because of the inherent problems with the related art, there is a need for a new and improved camouflage retractable media system for efficiently providing media devices that retract out-of-sight when not in use.

BRIEF SUMMARY OF THE INVENTION

The general purpose of the present invention is to provide a camouflage retractable media system that has many of the advantages of the media devices mentioned heretofore. The invention generally relates to a media device which includes a casing including a first end and a second end, wherein the first end includes a first opening and wherein the first opening extends through the first end. A chamber extends within the casing, wherein the chamber interconnects with the first opening. A drive unit extends within the chamber and a media device extends from the drive unit. A cap is positioned adjacent the first opening of the casing, wherein the cap includes a camouflage covering with respect to a surrounding environment. The drive unit selectively extends the media device outwardly from the first opening when in use and retracts the media device back within the chamber when not in use.

There has thus been outlined, rather broadly, some of the features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction or to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

An object is to provide a camouflage retractable media system for efficiently providing speakers that retract out-of-sight when not in use.

Another object is to provide a camouflage retractable media system that may efficiently blend in with various outdoor elements (e.g. grass, paver stones, driveways, decks, etc.).

An additional object is to provide a camouflage retractable media system that elevate from within the ground when the speaker is turned on.

A further object is to provide a camouflage retractable media system that retracts within the ground and out-of-sight when the speaker is turned off.

Another object is to provide a camouflage retractable media system that may withstand heavy objects (e.g. lawnmower, golf cart, etc.) on top of the system while retracted within the ground.

Other objects and advantages of the present invention will become obvious to the reader and it is intended that these objects and advantages are within the scope of the present invention. To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
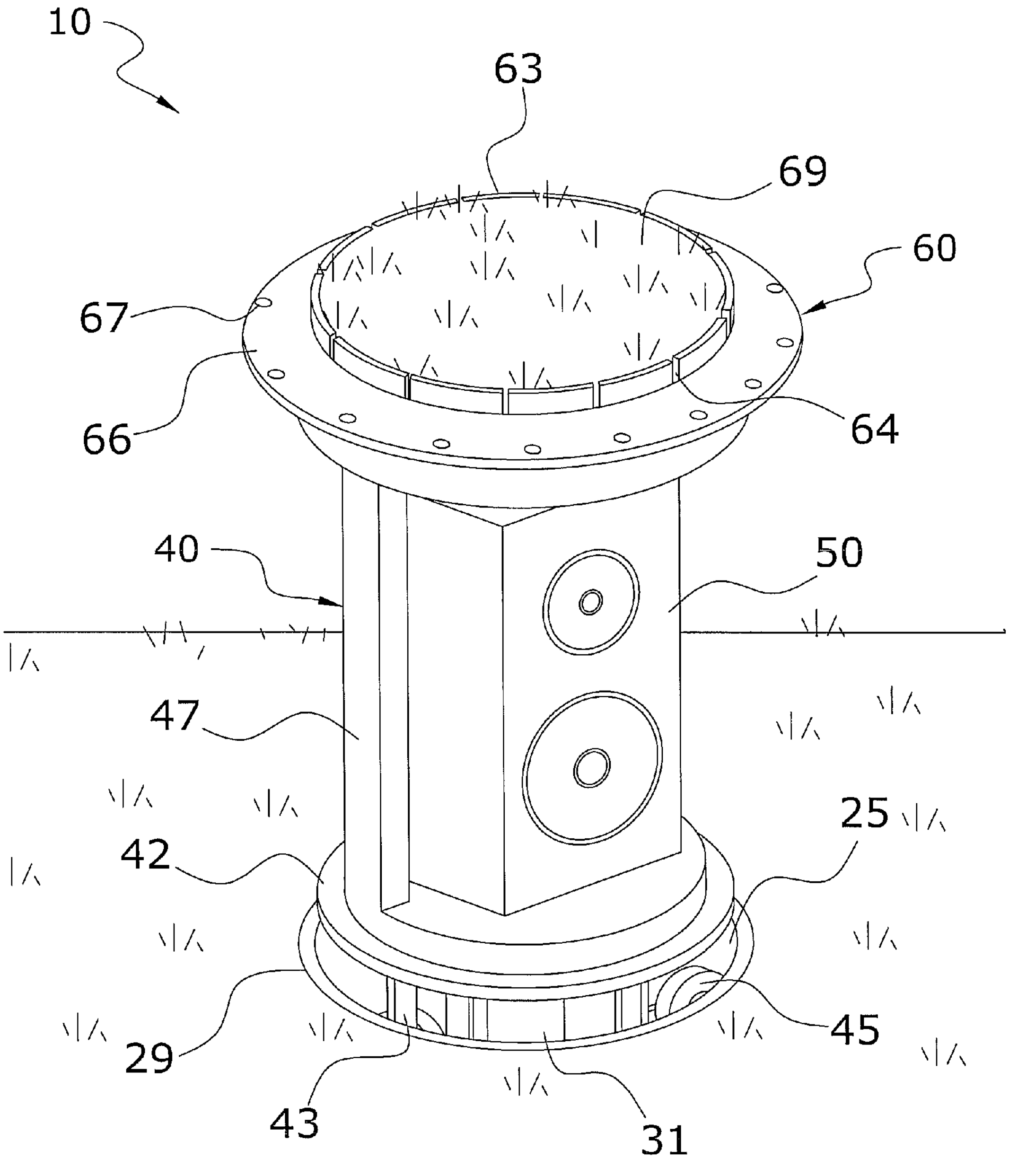
FIG. 1 is an upper perspective view of the present invention with a grass configuration camouflage covering and in an extended position.
Figure 2:
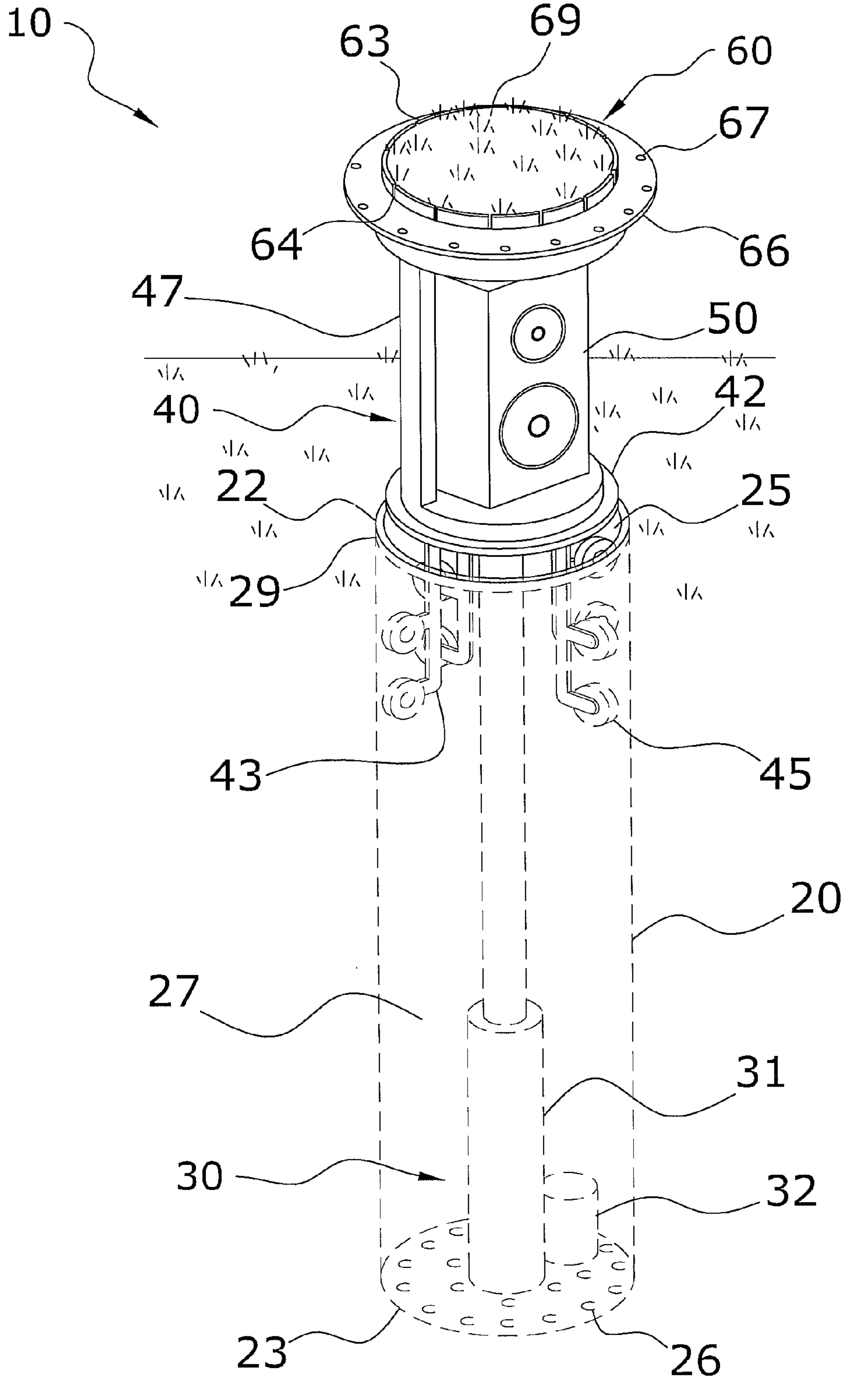
FIG. 2 is an upper perspective view of the present invention with a grass configuration camouflage covering, in an extended position and illustrating the casing and enclosed components.
Figure 3:
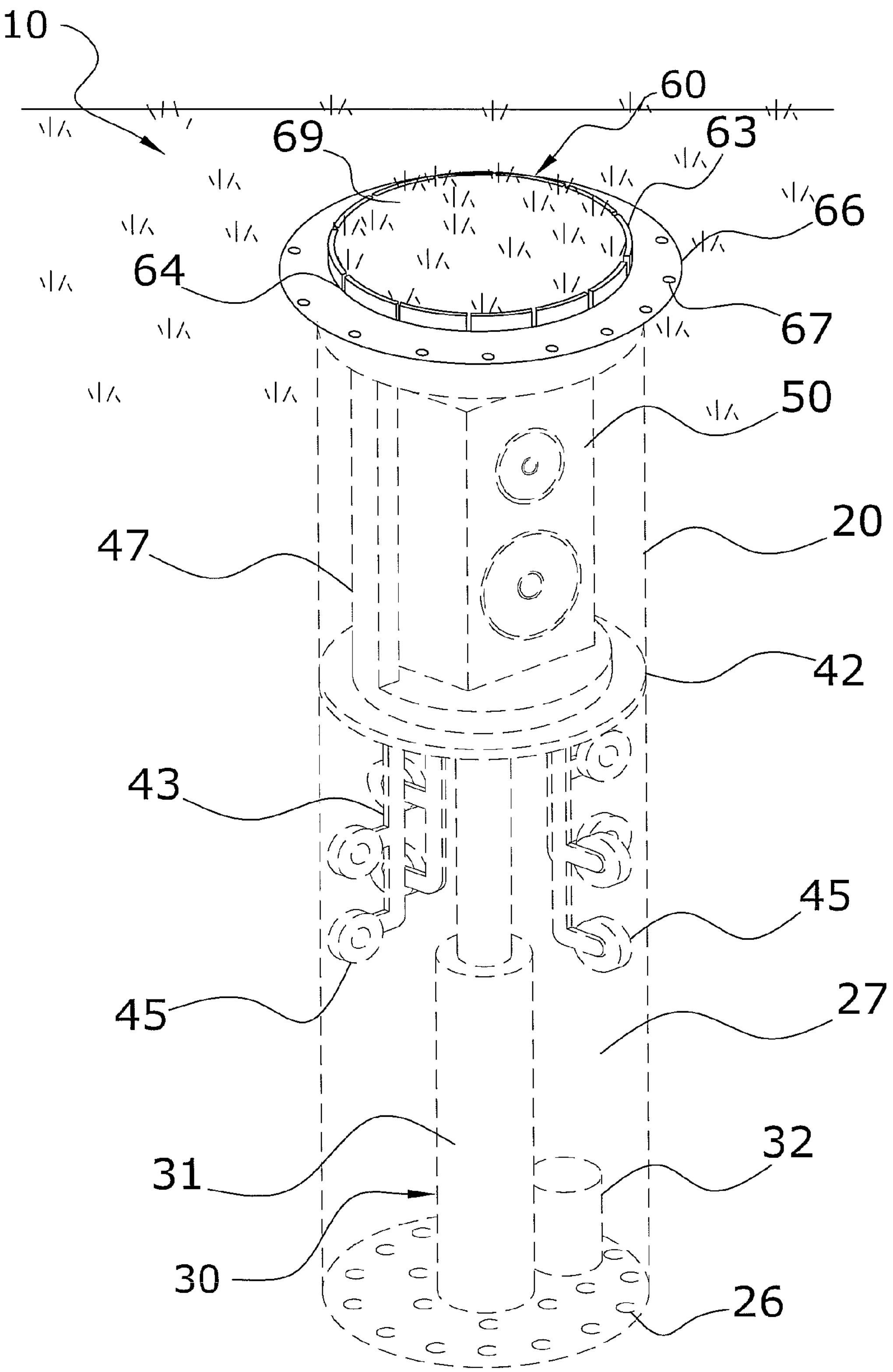
FIG. 3 is an upper perspective view of the present invention with a grass configuration camouflage covering, in a retracted position and illustrating the casing and enclosed components.

Turning now descriptively to the drawings, in which similar reference characters denote similar elements throughout the several views, FIGS. 1 through 8 illustrate a camouflage retractable media system 10, which comprises a casing 20 including a first end 22 and a second end 23, wherein the first end 22 includes a first opening 25 and wherein the first opening 25 extends through the first end 22. A chamber 27 extends within the casing 20, wherein the chamber 27 interconnects with the first opening 25. A drive unit 30 extends within the chamber 27 and a media device (e.g. speaker, etc.) extends from the drive unit 30. A cap 60 is positioned adjacent the first opening 25 of the casing 20, wherein the cap 60 includes a camouflage covering 69 with respect to a surrounding environment. The drive unit 30 selectively extends the media device outwardly from the first opening 25 when in use and retracts the media device back within the chamber 27 when not in use.

The casing 20 is preferably positioned within a hole 12 in a supporting structure 14. The supporting structure 14 may be comprised of various structures, such as but not limited to the ground, a wall, ceiling, floor, flower plant or various other structures. The hole 12 and the outer diameter of the casing 20 are preferably substantially similar in diameter and depth to substantially conceal the casing 20 from view. The casing 20 may also be positioned upon a foundation 16 at the bottom of the hole 12.

The foundation 16 is preferably comprised of gravel or crushed rock so as to allow water to drain from out of the second end 23 of the casing 20 and also to provide a solid support for the casing 20 and present invention. It is appreciated that the casing 20 may also be secured within the hole 12 via cement or other securing compounds. The present invention is preferably configured to keep out water, dirt, snow, mud or various other outdoor elements from within the chamber 27 of the casing 20.

B. Casing

The casing 20 is positioned within the ground or other object and protects the media device 50 from outside elements. The casing 20 is substantially hollow so as to receive the media device 50 and associated supporting components (i.e. inner support 40, drive unit 30, etc.). In the preferred embodiment, the casing 20 is comprised of a tubular configuration; however it is appreciated that the casing 20 may be comprised of various configurations rather than the preferred embodiment. The casing 20 is also comprised of a durable material, such as but not limited to plastic, wherein the casing 20 will not easily break or corrode over an extended period of time.

The casing 20 is preferably comprised of a substantially uniform diameter as illustrated in FIGS. 2 through 6. The rollers of the inner support 40 are thus able to smoothly slide along the inner surface of the casing 20 to support the media device 50 when lifting and lower the media device 50. The casing 20 also includes a first opening 25 extending through the first end 22 of the casing 20. At least a portion of the inner support 40 and the media device 50 are able to extend through the first opening 25 when lifting the media device 50 and inner support 40. The first end 22 and the first opening 25 are also preferably positioned below the outer surface of the supporting structure 14 as illustrated in FIGS. 1 through 8.

Figure 4:
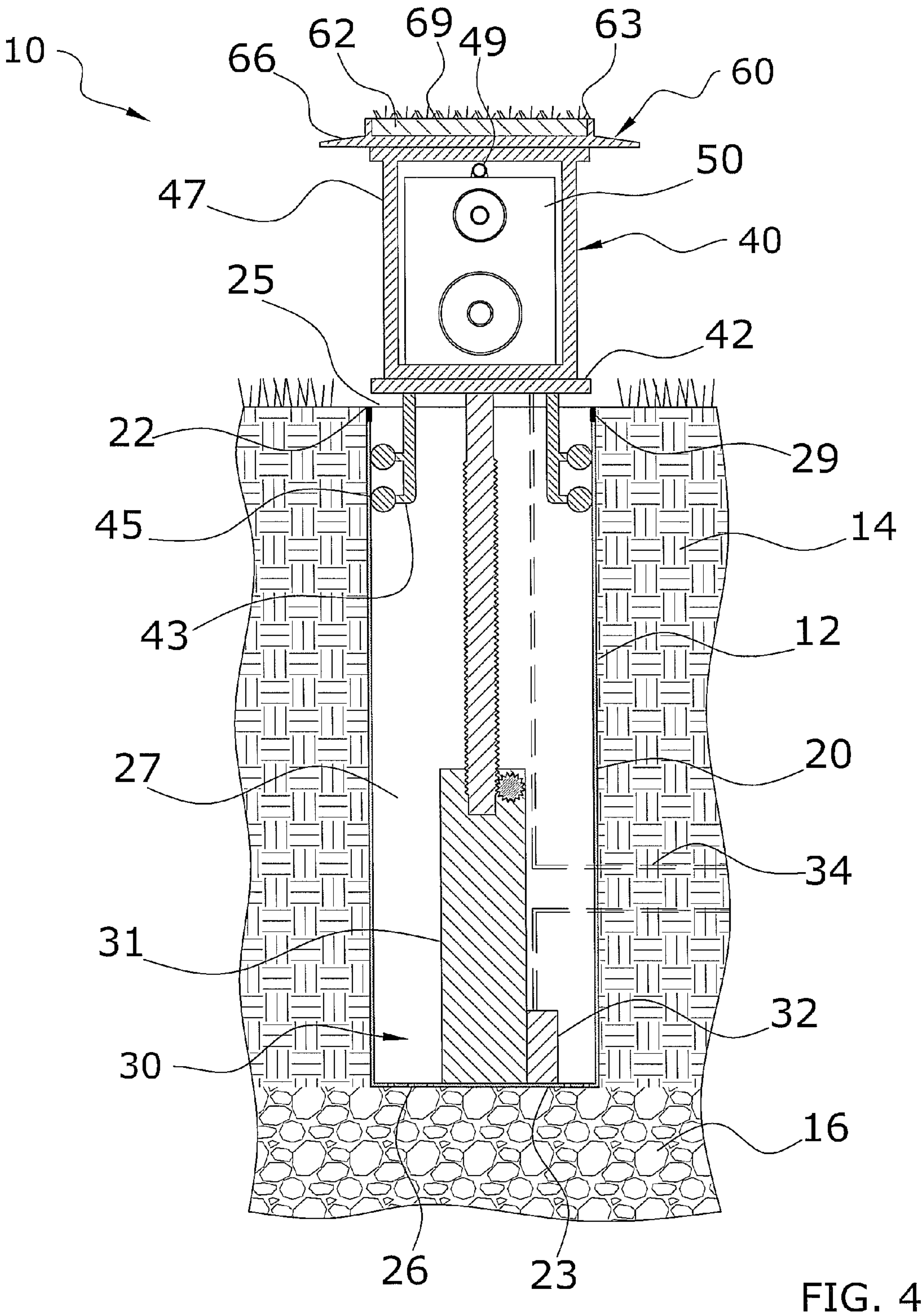
FIG. 4 is a cross-sectional view of the present invention in an extended position.
Figure 5:
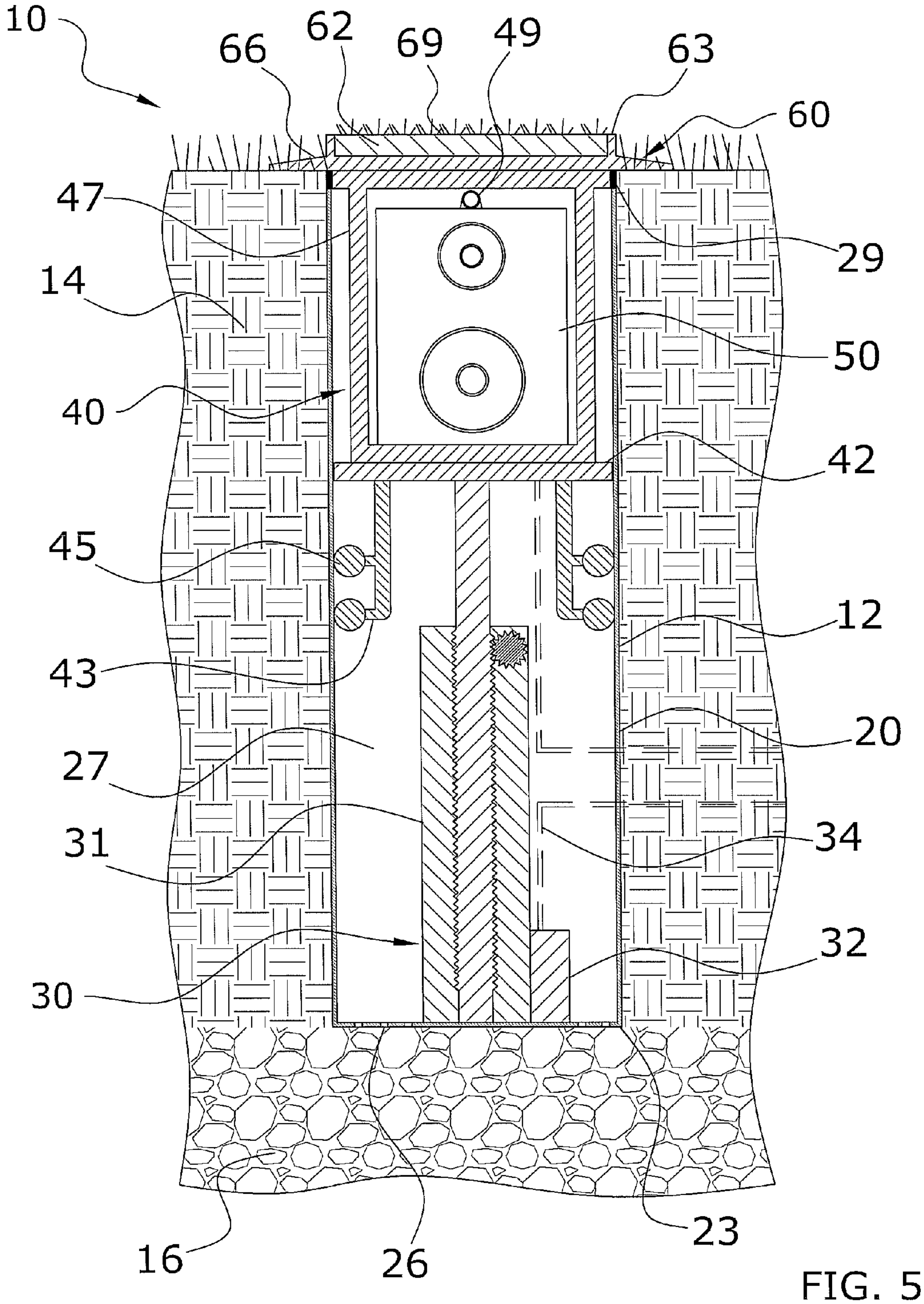
FIG. 5 is a cross-sectional view of the present invention in a retracted position.
Figure 6:
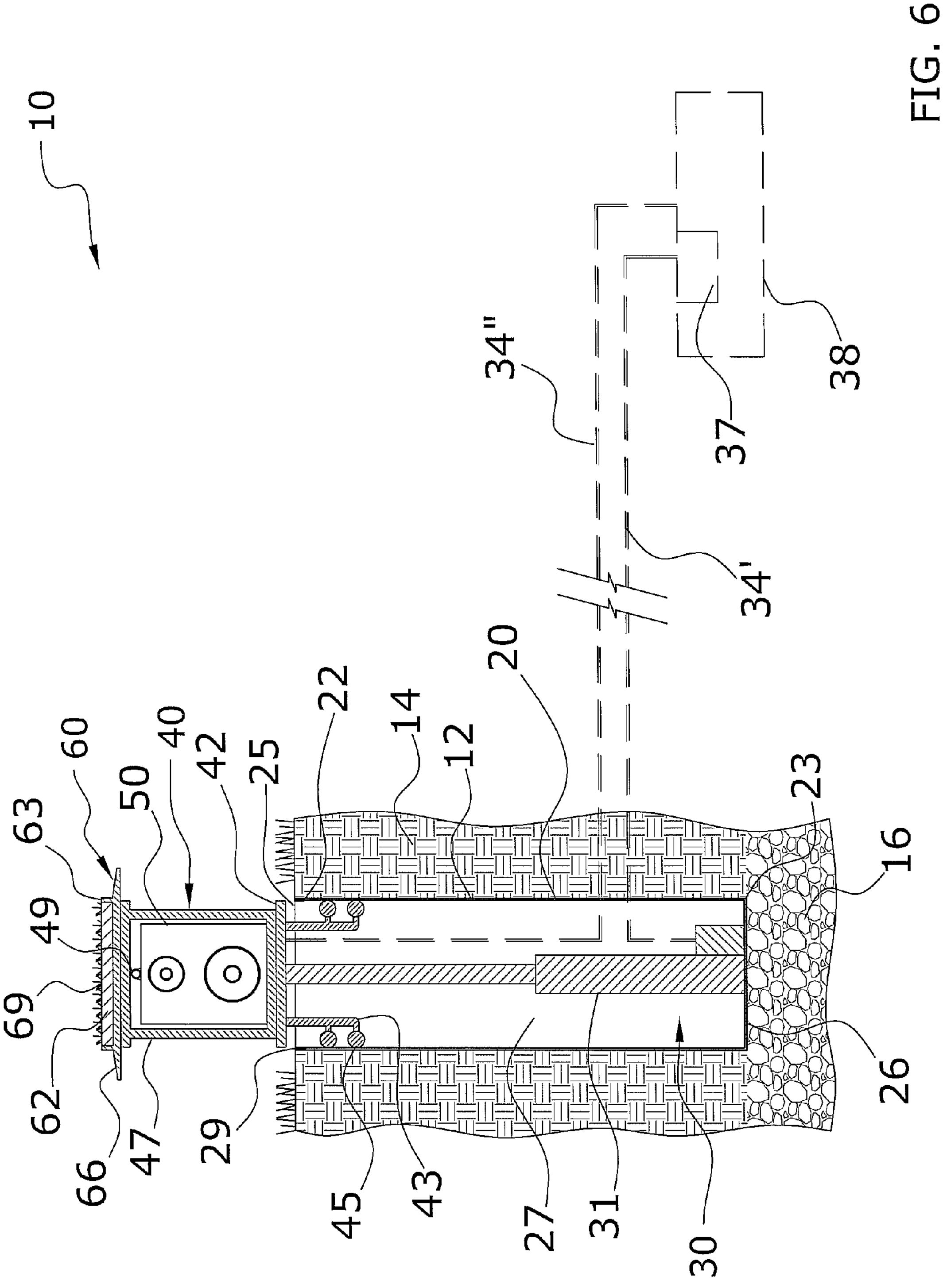
FIG. 6 is a cross-sectional view of the present invention in an extended position and illustrating the electrical connection between the drive unit and control unit and the speaker and the receiver.

A sealing member 29 also preferably extends around the first end 22 of the casing 20 as illustrated in FIGS. 4 and 5. The sealing member 29 is sandwiched between the first end 22 of the casing 20 and the cap 60 to help prevent water or other foreign elements from seeping within the casing 20 between the first end 22 and the cap 60. The sealing member 29 may be comprised of various materials, such as but not limited to rubber. The sealing member 29 may also be comprised of various configurations, such as but not limited to weather stripping.

Although the casing 20 is preferably waterproof and sealed tightly from foreign elements when the present invention is in the closed position, it is appreciated that from time to time water or other foreign elements may enter within the casing 20, such as when the present invention is in the extended position. For this reason, the casing 20 also preferably includes a plurality of second openings 26 extending through the second end 23 of the casing 20 as illustrated in FIGS. 2 through 5. The second openings 26 allow any foreign water or material to drain out of the casing 20 through the second openings 26 so as to prevent excess water or other material from building up within chamber 27 of the casing 20.

C. Drive Unit

The drive unit 30 is positioned within the chamber 27 of the casing 20 and selectively lifts and lowers the media device 50 as illustrated in FIGS. 1 through 8. The drive unit 30 is further preferably positioned between the media device 50 and the second end 23 of the casing 20. The drive unit 30 extends the media device 50 outwardly from the opening upon being activated, maintains the media device 50 in an outwardly extended position while in use and also retracts the media device 50 within the chamber 27 when not in use. The drive unit 30 also preferably keeps the cap 60 and attached media device 50 in a locked position when not in use and retracted within the chamber 27 to prevent unauthorized extension or removal of the cap 60 or media device 50 from the chamber 27.

The drive unit 30 preferably includes a linear actuator 31 and a motor 32 connected to the linear actuator 31 to operate the linear actuator 31. The linear actuator 31 is preferably comprised of a telescoping configuration or worm gear configuration as illustrated in FIGS. 4 and 5. The motor 32 is preferably comprised of an electric motor 32. The motor 32 is electrically connected to a control unit 37 and a power supply.

The motor 32 is preferably connected to the control unit 37 and the power supply via one or more electrical wires 34'. The wires 34' preferably extend through a side or second end 23 of the casing 20 and are ran underground so as to not be in the way or visible. The control unit 37 may include a switch for turning on the motor 32 and actuator 31. The control unit 37 may be comprised of a separate structure than the receiver 38 or may be directly wired or integrated with a media receiver 38, wherein turning the receiver 38 on subsequently sends a signal to the motor 32 to turn the motor 32 on and activate the actuator 31.

The power supply may also be comprised of an AC power supply from an outlet or a DC power supply from a battery. The actuator 31 is also able to lift substantially heavy objects, wherein the cap 60 may be comprised of heavy structures, such as a paving stone. The control unit 37 and thus motor 32 and actuator 31 may also be controlled via a remote control.

D. Inner Support

The inner support 40 extends from the actuator 31 and supports the media device 50 as illustrated in FIGS. 1 through 8. It is appreciated that the inner support 40 may be integrally formed with the media device 50 or the inner support 40 and the media device 50 may be comprised of separate structures. The diameter of the inner support 40 is also less than the diameter of the chamber 27 and the first opening 25 of the casing 20 to allow the inner support 40 to efficiently move within the chamber 27 and through the first opening 25. The inner support 40 may be comprised of various materials, such as but not limited to plastic, aluminum or stainless steel.

The inner support 40 also preferably includes a platform portion 42 to position the speaker upon. The inner support 40 may be attached to the actuator 31 by various methods, such as but not limited to a cotter pin, integrally formed or various other manners. The platform portion 42 is thus preferably positioned between the media device 50 and the actuator 31. The inner support 40 may also include a plurality of lower supports 43 radiating from the platform portion 42. The inner support 40 preferably includes four lower supports 43 equidistantly spaced around the perimeter of the platform.

Each of the lower supports 43 preferably includes a pair of stabilizing rollers 45 rotatably attached to the respective lower support 43. The stabilizing rollers 45 engage the inner surface of the casing 20 and serve to stabilize the inner support 40 and media device 50 while lifting and lowering the media device 50 with respect to the casing 20. When the present invention is in an in use position (i.e. extended), the stabilizing rollers 45 are preferably adjacent the first opening 25 of the casing 20; however it is appreciated that the stabilizing rollers 45 do not extend upwards beyond the first opening 25, wherein the stabilizing rollers 45 remain within the chamber 27 of the casing 20.

A plurality of upper supports 47 may also extend from the first end 22 of the inner support 40 or the media device 50. The upper supports 47 may also be integrally formed with the platform portion 42 or lower supports 43 of the inner support 40. The upper supports 47 further preferably connect the inner support 40 to the cap 60. The upper supports 47 create a space between the media device 50 and the cap 60 in which to position an LED 49. The LED 49 is preferably positioned between the media device 50 and the cap 60 and is also preferably electrically connected to the control unit 37. The LED 49 turns on when the media device 50 is in the extended position and turned on. The LED 49 may thus act as an indicator or simply a light to inform others where the present invention is positioned in dim or dark lit situations.

It is appreciated that the inner support 40 may also be mechanically connected to the inner surface of the casing 20 via a plurality of guide rails or tracks to stabilize the inner support 40 while extending and retracting the inner support 40 and also to keep the inner support 40 from rotating. The guide rails and/or tracks may be utilized in replacement of or in addition to the rollers.

E. Media Device

The media device 50 is preferably comprised of a speaker; however it is appreciated that the media device 50 may be comprised of various other media devices 50 rather than a speaker. The media device 50 is further preferably comprised of a high quality speaker. The media device 50 may also be comprised of an outdoor speaker; however since the media device 50 is stored within the casing 20 when not in use and protected from the outside elements, it may not be necessary to utilize an outdoor speaker.

The media device 50 is also electrically connected to the receiver 38 via a wire(s) 34", wherein the wire(s) 34" is preferably are ran through the side of the casing 20 and underground similar to the wires 34' connecting the motor 32 to the control unit 37 and power supply. It is appreciated that the media device 50 may also be wirelessly connected to the receiver 38. The receiver 38 may be comprised of various types of receivers 38 commonly utilized to connect various types of media devices 50 (i.e. speaker) to.

The media device 50 is movably positioned within the chamber 27. It is appreciated that the media device 50 may extend and retract from the chamber 27 via the drive unit 30. It is also appreciated that the media device 50 may be move in and out of the chamber 27 utilizing various other means rather than the drive unit 30.

F. Cap

Figure 7:
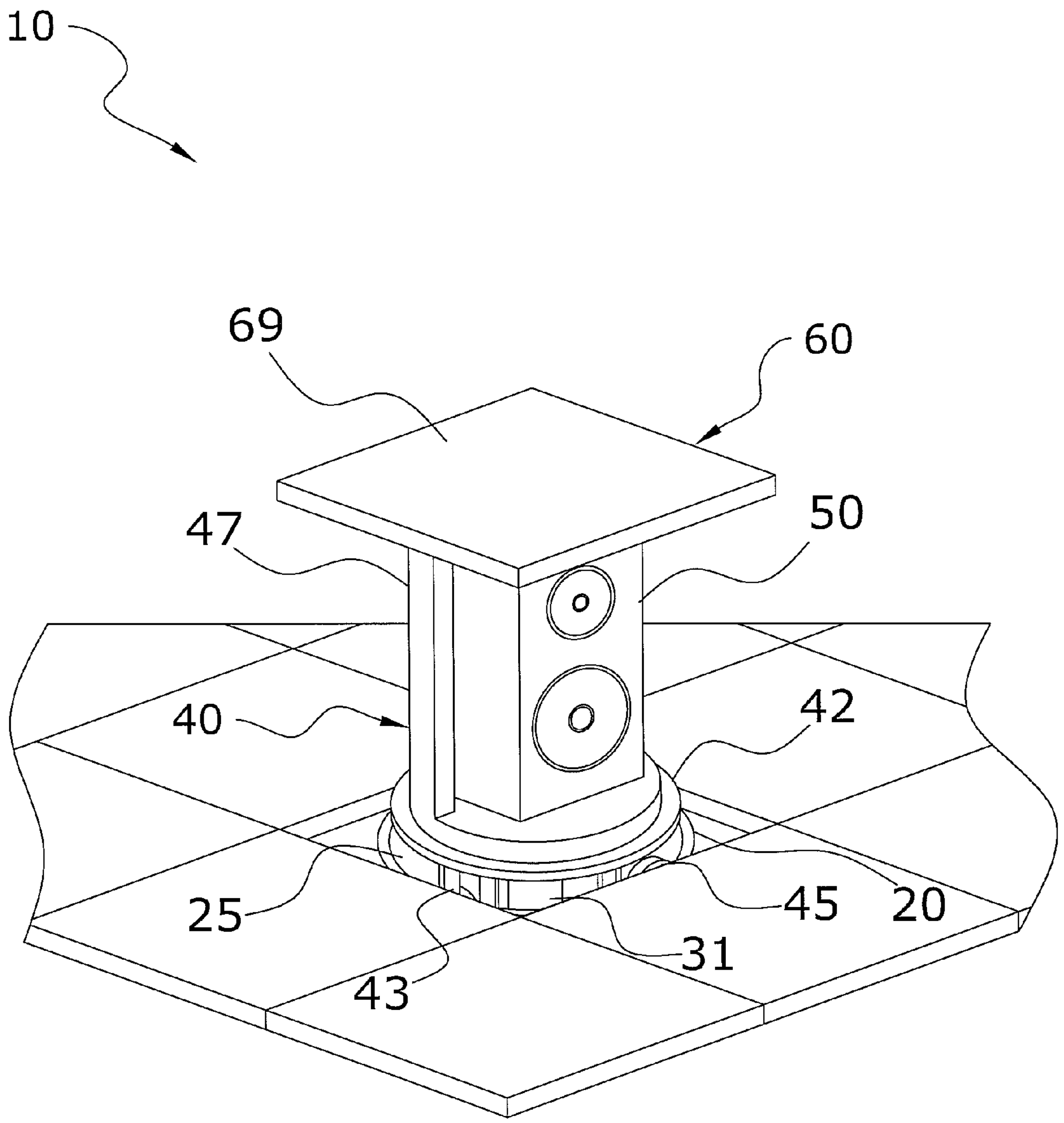
FIG. 7 is an upper perspective view of the present invention with a paver stone configuration camouflage covering and in an extended position.
Figure 8:
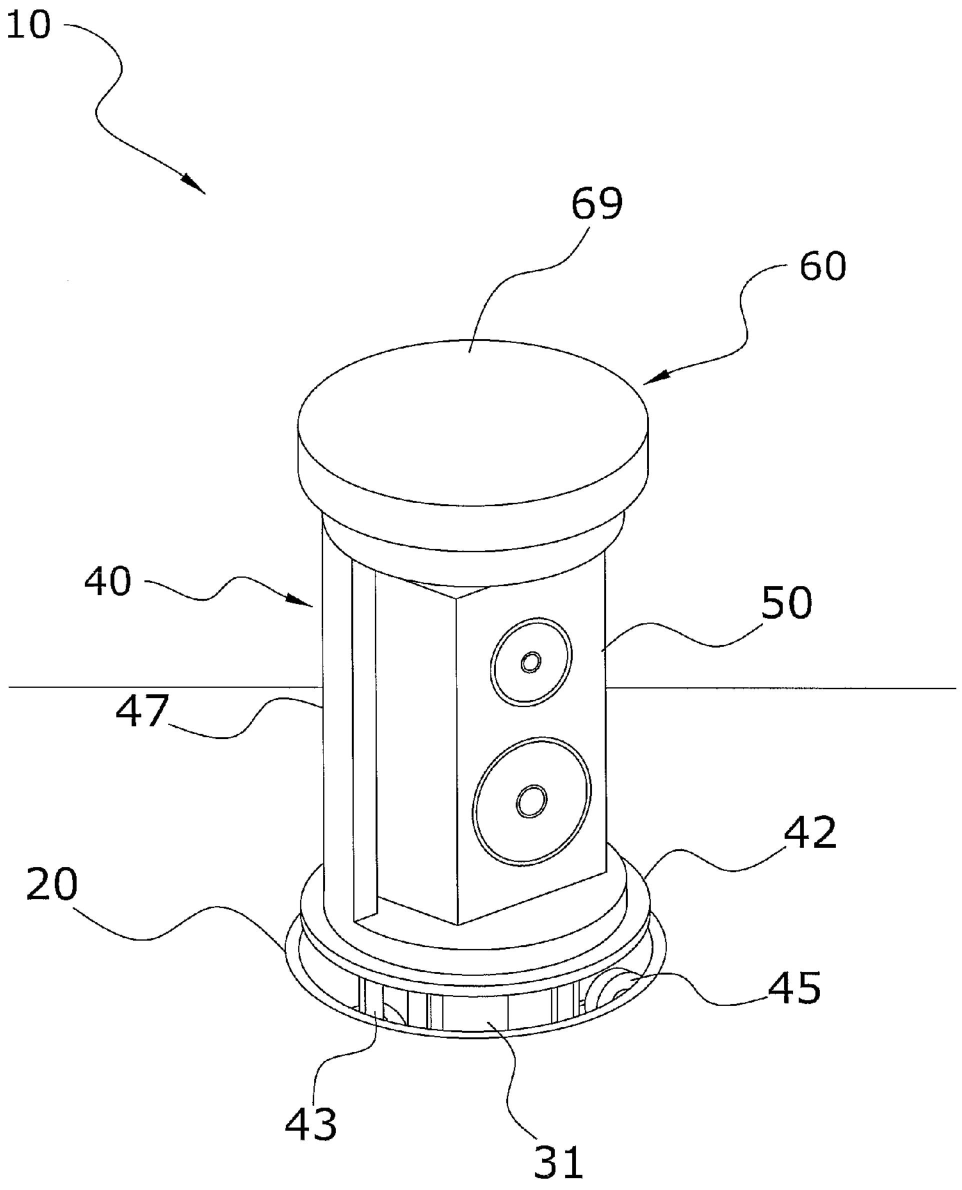
FIG. 8 is an upper perspective view of the present invention with a circular disc shaped camouflage covering and in an extended position.

The cap 60 is attached to the first end 22 of the inner support 40 and is preferably the only visible portion of the present invention when the present invention is in the retracted position. The cap 60 may include various types of camouflage coverings 69 to conceal the cap 60 from being easily noticed. In various embodiments of the present invention the camouflage covering 69 is comprised of natural grass growing within the cap 60 as illustrated in FIGS. 1 through 6, a paving stone as illustrated in FIG. 7, a lid configuration as illustrated in FIG. 8, landscape rocks, artificial grass, marble, granite, decorative stones, planters, glass or various others all which preferably blend in with the surrounding environment or are not easily noticeable.

In the embodiment, wherein the cap 60 is designed to include natural growing grass, the cap 60 preferably includes a central cavity 62, an inner rim 63 surrounding the cavity 62, a plurality of slots 64 extending through the inner rim 63 and a flange portion 66 extending from the inner rim 63. Grass is preferably grown from the cap 60 via placing sod or dirt and/or bedding material within the cavity 62. Excess water from rain or watering the grass is also able to escape the cavity 62 via the slots 64 extending through the inner rim 63.

The excess water is then able to trickle down the flange and off the side of the flange portion 66 or through a plurality of openings extending through the flange portion 66. The cap 60 preferably lowers to a level consistent with the level of the ground surface, thus allowing the grass within the cavity 62 to grow at a substantially similar height as the surrounding grass outside the cavity 62. An individual may subsequently mow over both the grass within the cavity 62 and the surrounding grass easily and without having to mow around any unnecessary objects.

The diameter of the inner rim 63 is preferably substantially similar to the diameter of the first end 22 of the casing 20 as illustrated in FIGS. 4 and 5. The flange portion 66 of the cap 60 radiates outwardly from the inner rim 63, wherein the flange portion 66 overhangs the first end 22 to allow the water to drain sufficiently away from the first opening 25 and prevent the water from draining within the chamber 27 of the casing 20. The cap 60 is also comprised of a substantially strong material and is efficiently supported via the casing 20 to withstand excessive amounts of weight, such as from lawn mowers, golf carts, ATVs or various other objects.

G. Operation of Preferred Embodiment

In use, the present invention is installed within a hole 12 in the ground (or desired supporting structure 14) and the motor 32, actuator 31, speaker(s) 50 and LED 49 are electrically connected to the control unit 37, receiver 38, power supply and any other control means that are necessary to operate the present invention. In the preferred embodiment, the control unit 37 and power supply are directly wired to or integrated with the receiver 38, wherein the receiver 38 is simply turned on and power is sent to the motor 32 thus causing the motor 32 to start and the actuator 31 to extend the inner support 40, cap 60 and speaker outwardly from the first opening 25.

Once the actuator 31 is fully extended, the actuator 31 automatically stops in the uppermost position. The speaker is also preferably activated when activating the receiver 38, thus causing the speaker to play the desired sound channeled through the speaker wires 34" from the receiver 38. The LED 49 is also automatically turned on to alert that the present invention is in use, extended and operating correctly. When the individual is finished utilizing the present invention, the receiver 38 is turned off, thus turning off the speaker. Turning the receiver 38 off automatically retracts the actuator 31 and thus retracts the inner support 40, cap 60 and speaker within the chamber 27. The present invention thus returns to a retracted position and the cap 60 once again conceals the present invention via the camouflage covering 69.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

I claim:

1. A camouflage retractable media system, comprising:

a casing including a first end and a second end, wherein said first end includes a first opening and wherein said first opening extends through said first end;

a chamber extending within said casing, wherein said chamber interconnects with said first opening;

a media device movably positioned within said chamber; and a cap positioned adjacent said first opening of said casing, wherein said cap includes a camouflage covering;

wherein said cap includes an inner rim extending outwardly from said cap;

wherein said cap includes a cavity defined by said inner rim;

wherein said cap includes a flange portion extending outwardly from inner rim;

wherein said cap includes a plurality of slots extending through said inner rim, wherein said plurality of slots interconnect said flange portion with said cavity.

2. The camouflage retractable media system of claim 1, wherein said camouflage covering is comprised of grass.

3. The camouflage retractable media system of claim 1, wherein said camouflage covering is comprised of a paver stone.

4. The camouflage retractable media system of claim 1, wherein said casing is positioned within a supporting structure.

5. The camouflage retractable media system of claim 4, wherein said first end and said first opening are substantially level with a surface of said supporting structure.

6. The camouflage retractable media system of claim 1, wherein said media device is comprised of a speaker.

7. A camouflage retractable media system, comprising:

a casing including a first end and a second end, wherein said first end includes a first opening and wherein said first opening extends through said first end;

a chamber extending within said casing, wherein said chamber interconnects with said first opening;

a drive unit extending within said chamber;

a media device extending from said drive unit; and a cap positioned adjacent said first opening of said casing, wherein said cap includes a camouflage covering;

wherein said cap includes an inner rim extending outwardly from said cap;

wherein said cap includes a cavity defined by said inner rim;

wherein said cap includes a flange portion extending outwardly from inner rim;

wherein said cap includes a plurality of slots extending through said inner rim, wherein said plurality of slots interconnect said flange portion with said cavity.

8. The camouflage retractable media device system of claim 7, wherein said media device is extended outwardly from said first opening via said drive unit.

9. The camouflage retractable media device system of claim 7, wherein said media device and said cap are extended outwardly from said first opening via said drive unit.

10. The camouflage retractable media device system of claim 7, including an inner support extending within said chamber, wherein said inner support supports said media device.

11. The camouflage retractable media device system of claim 10, wherein said inner support includes a plurality of stabilizer rollers.

12. The camouflage retractable media device system of claim 10, wherein said drive unit extends between said second end and an inner end of said inner support.

13. The camouflage retractable media device system of claim 7, wherein said drive unit is comprised of a linear actuator.

14. The camouflage retractable media device system of claim 13, wherein said drive unit is comprised of a worm gear configuration.

15. The camouflage retractable media system of claim 7, wherein said media device is comprised of a speaker.

16. A camouflage retractable media system, comprising:

a casing including a first end and a second end, wherein said first end includes a first opening and wherein said first opening extends through said first end;

a chamber extending within said casing, wherein said chamber interconnects with said first opening;

wherein said casing is positioned within a supporting structure and wherein said first end and said first opening are substantially level with a surface of said supporting structure;

a drive unit extending within said chamber;

an inner support extending within said chamber, wherein said inner support includes a plurality of stabilizer rollers;

a speaker supported by said inner support; and a cap including a camouflage covering, wherein said cap extends from said speaker opposite said drive unit;

wherein said cap includes an inner rim extending outwardly from said cap;

wherein said cap includes a cavity defined by said inner rim;

wherein said cap includes a flange portion extending outwardly from inner rim;

wherein said cap includes a plurality of slots extending through said inner rim, wherein said plurality of slots interconnect said flange portion with said cavity;

wherein said speaker and said cap are extended outwardly from said first opening via said drive unit;

wherein said drive unit extends between said second end and an inner end of said inner support;

wherein said drive unit is comprised of a linear actuator and wherein said drive unit is comprised of a worm gear configuration.

* * * * *